US008547091B2

(12) United States Patent  (10) Patent No.: US 8,547,091 B2
Yamane et al.  (45) Date of Patent: Oct. 1, 2013

(54) METHOD FOR MEASURING RESISTANCE OF RESISTOR CONNECTED WITH MR ELEMENT IN PARALLEL

(75) Inventors: Takekazu Yamane, Tokyo (JP); Naomichi Degawa, Tokyo (JP)

(73) Assignee: TDK Corporation, Tokyo (JP)

( * ) Notice: Subject to any disclaimer, the term of this patent is extended or adjusted under 35 U.S.C. 154(b) by 393 days.

(21) Appl. No.: 12/967,492

(22) Filed: Dec. 14, 2010

(65) Prior Publication Data

US 2012/0146633 A1 Jun. 14, 2012

(51) Int. Cl.
G01R 33/02 (2006.01)
(52) U.S. Cl.
USPC .......................................... 324/252
(58) Field of Classification Search
USPC .......................................... 324/252
See application file for complete search history.

(56) References Cited

FOREIGN PATENT DOCUMENTS

JP 2004-234755 A 8/2004

*Primary Examiner* — Reena Aurora
(74) *Attorney, Agent, or Firm* — Posz Law Group, PLC (57) ABSTRACT

A measuring method measuring a resistance of a resistor of a magnetic sensor that includes the resistor is provided. The method includes a step of measuring an output voltage of the magnetic sensor in an AC magnetic field, a step of measuring a first combined resistance of the MR element and the resistor in no magnetic field, a step of measuring a second combined resistance of the MR element and the resistor in a constant magnetic field of which a direction and strength are substantially the same as a magnetic field, a step of measuring a third combined resistance of the MR element and the resistor in another constant magnetic field of which a direction and strength are substantially the same as another magnetic field, and a step of calculating the resistance of the resistor based on the output voltage, the first, second and third combined resistance.

12 Claims, 11 Drawing Sheets

Fig.1

RELATED ART

METHOD FOR MEASURING RESISTANCE OF RESISTOR CONNECTED WITH MR ELEMENT IN PARALLEL

TECHNICAL FIELD

The present invention relates to a method for measuring resistance of a resistor connected in parallel with a magneto resistance effect (MR) element included in a magnetic sensor, and more specifically to a method for measuring a resistance of the resistor that is built into the magnetic sensor without breaking the magnetic sensor.

BACKGROUND

There is a magnetic sensor that includes a magneto resistance effect (MR) element in which electrical resistance varies corresponding to an external magnetic field. One example of such a magnetic sensor is a thin film magnetic head that reads magnetic information written to a recording medium such as a hard disk.

A current in plane (CIP) element, in which a sense current flows in an in-plane direction of a film surface, and a current perpendicular to plane (CPP) element, in which a sense current flows in a direction orthogonal to a film surface, have been developed as MR elements. As the CPP element, a tunnel magneto-resistance (TMR) element to which a TMR effect is applied and a giant magneto resistance (GMR) element to which a GMR effect is applied are known.

One example of the MR element is an element including a spin-valve film (hereafter, referred to as an SV film). The SV film includes a pinned layer in which a magnetization direction is pinned with respect to an external magnetic field, a free layer in which a magnetization direction varies corresponding to an external magnetic field, and a spacer layer that is sandwiched by the pinned layer and the free layer. The SV film is sandwiched by a pair of electrode layers that supply a sense current. A resistance of the SV film varies depending on a relative angle of the magnetization direction of the pinned layer and the magnetization direction of the free layer. By detecting the variation of the resistance, the magnetic sensor measures an external magnetic field.

JP Patent Application Publication No. 2004-234755A discloses a thin film magnetic head including a resistor connected in parallel with an MR element. The resistor prevents the occurrence of electrostatic discharge (ESD) damage caused by a large current flowing in the MR element.

Specifically, the TMR element has a small breakdown voltage compared to the GMR element, and in turn ESD damage is highly likely to occur. In a magnetic sensor including the TMR element, the resistor is, in many cases, connected with the TMR element in parallel to prevent the ESD damage.

An output value of the magnetic sensor depends on a resistance of the resistor. Therefore, a resistor is produced such that a resistance is a preset value. However, the resistance of the resistor may vary because of a manufacturing process. When the resistance of the resistor varies widely, the performance of the magnetic sensor decreases.

Therefore, it is desired to examine whether the resistance is within the predefined range by measuring the resistance of the resistor after the manufacture of the magnetic sensor. However, in case the resistor is built into the magnetic sensor and is not externally exposed, it is impossible to directly measure the resistance of the resistor. Specifically, in case the TMR element and the resistor are embedded in an insulation layer like the thin film magnetic head, it is impossible to directly measure the resistance of the resistor without breaking the thin film magnetic head.

Therefore, it is desired to provide a method for measuring a resistance of a resistor connected in parallel with an MR element without breaking a magnetic sensor.

SUMMARY

An embodiment of the present invention relates to a measuring method that measures a resistance of a resistor of a magnetic sensor that includes a magneto resistance effect (MR) element and the resistor connected in parallel with the MR element. The method includes: a step of measuring an output voltage of the magnetic sensor in an alternating-current (AC) magnetic field, the output voltage being defined by a difference between a voltage of the magnetic sensor when the AC magnetic field is a maximal value and another voltage of the magnetic sensor when the AC magnetic field is a minimal value, a step of measuring a first combined resistance of the MR element and the resistor in no magnetic field, a step of measuring a second combined resistance of the MR element and the resistor in a constant magnetic field of which a direction and strength are substantially the same as a magnetic field in which the AC magnetic field is the maximum value, a step of measuring a third combined resistance of the MR element and the resistor in another constant magnetic field of which a direction and strength are substantially the same as another magnetic field in which the AC magnetic field is the minimum value, and a step of calculating the resistance of the resistor based on the output voltage, the first combined resistance, the second combined resistance, and the third combined resistance.

With the above measuring method, the resistance of the resistor is calculated based on the output voltage of the magnetic sensor and the measured values of the first to third combined resistances. Since the physical quantities are obtained by measuring over an entirety of the magnetic sensor, it is unnecessary to measure directly the MR element and the resistor. Therefore, even when the MR element or the resistor is built into the magnetic sensor, the resistance of the resistor is measured without breaking the magnetic sensor.

The above and other objects, features and advantages of the present invention will become apparent from the following description with reference to the accompanying drawings which illustrate examples of the present invention.

DETAILED DESCRIPTION OF THE INVENTION

Hereafter, a first embodiment of the present invention will be explained referring to the drawings. In a measuring method of the present invention, a resistance of a resistor, which is connected in parallel with an MR element, for ESD damage prevention is measured.

Figure 1:
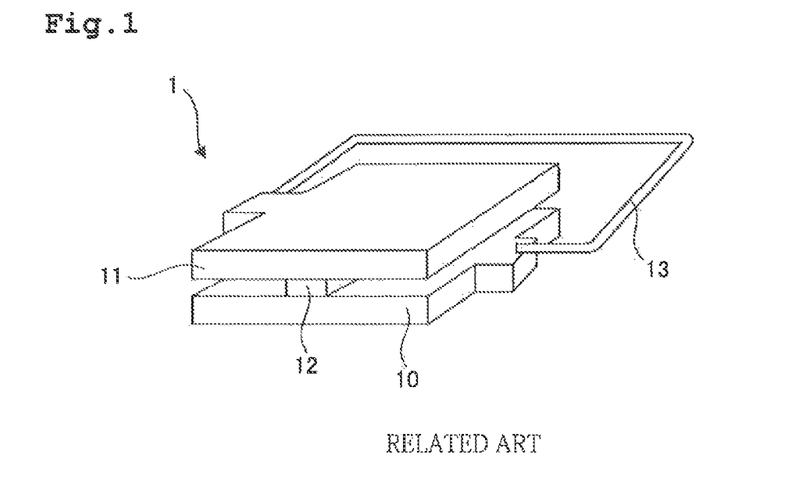
FIG. 1 is a schematic perspective view of a magnetic sensor including a resistor connected in parallel with an MR element.

First, an example of a magnetic sensor to which the measuring method of the present invention is applied will be explained. FIG. 1 is a schematic perspective view of a magnetic sensor including an MR element. A magnetic sensor 1 may be used as, for example, a thin film magnetic head that reads magnetic information written to the recording medium. The magnetic sensor 1 includes an MR element 12 in which electrical resistance varies depending on an external magnetic field. The MR element 12 is sandwiched by a pair of electrode layers 10 and 11 that apply a voltage to the MR element 12. The electrode layers 10 and 11 supply a sense current to the MR element 12. The magnetic sensor 1 includes a resistor 13 connected in parallel with the MR element 12. The resistor 13 is disposed to prevent the occurrence of ESD damage in the MR element 12.

Figure 2:
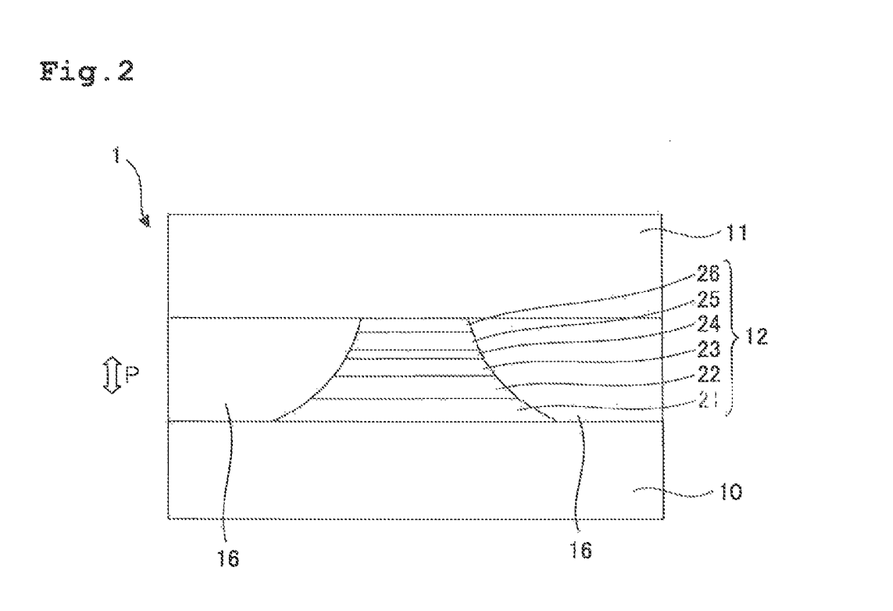
FIG. 2 is a schematic plan view of the magnetic sensor, as seen from a sensing surface.

FIG. 2 is a schematic plan view of the magnetic sensor, as seen from a sensing surface, and illustrates an example of a configuration of the MR element 12 in detail. Herein, the sensing surface is a surface of the magnetic sensor 1, which senses an external magnetic field. In the case where the magnetic sensor 1 is a thin film magnetic head, the sensing surface corresponds to a surface (ABS) that faces a recording medium in which magnetic information is written.

The MR element 12 includes an under layer 21, a pinning layer 22, a pinned layer 23, a spacer layer 24, a free layer 25, and a cap layer 26. The free layer 25 is a magnetic layer in which a magnetization direction varies corresponding to an external magnetic field. The pinned layer 23 is a magnetic layer in which a magnetization direction is pinned with respect to the external magnetic field. The spacer layer 24 is disposed between the pinned layer 23 and the free layer 25.

A relative angle between the magnetization direction of the free layer 25 and the magnetization direction of the pinned layer 23 increases or decreases corresponding to the direction of the external magnetic field. Corresponding to the variation of the relative angle, a resistance of the MR element 12 varies. Therefore, by measuring an output corresponding to the resistance of the MR element 12, the magnetic sensor 1 can detect the external magnetic field.

The under layer 21 is disposed as a base of the pinning layer 22. The cap layer 26 protects each of the layers 22, 23, 24 and 25 that configure the MR element 12, and is made of an insulator, a nonmagnetic metal, or the like.

The spacer layer 24 is disposed to give a distance between the free layer 25 and the pinned layer 23. When the spacer layer 24 is a nonmagnetic conductive body, the MR element 12 is referred to as a GMR element. When the spacer layer 24 is an insulation layer, a tunnel current flows in the spacer layer 24. Such an MR element 12 is referred to as a TMR element.

Insulation layers 16 are disposed on both sides of the MR element 12. The resistor 13 is generally embedded in the insulation layers 16 and protected by the insulation layers 16. In addition, the insulation layers 16 are not illustrated in FIG. 1.

Hereafter, a method for measuring a resistance of the resistor 13 of the magnetic sensor 1 and a measuring principle will be explained. In the present invention, a resistance and an output of the MR element 12 and a resistance of the resistor 13 are not directly measured. The resistance of the resistor 13 is calculated based on a combined resistance of the MR element 12 and the resistor 13 and an output voltage of the magnetic sensor 1.

Figure 3:
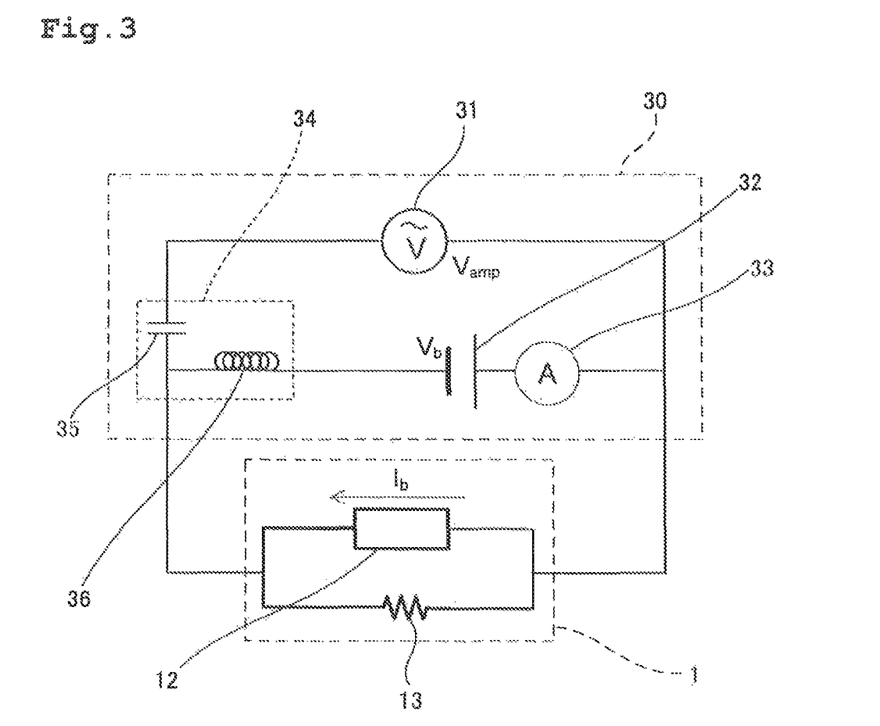
FIG. 3 is a circuit diagram illustrating an equivalent circuit of a complete system including a measuring system connected with the magnetic sensor and the magnetic sensor.

An example of a configuration of a measuring system used for measuring a resistance of the resistor 13 will be explained referring to FIG. 3. FIG. 3 illustrates an equivalent circuit of a total system including the magnetic sensor 1 and a measuring system 30 connected with the electrode layers 10 and 11 of the magnetic sensor 1.

The measuring system 30 includes a measuring circuit that includes an AC voltmeter 31, a DC power source 32, an ammeter 33 and a bias tee 34, and a magnetic field generator (not shown). The magnetic field generator may apply an AC magnetic field and a constant magnetic field (DC magnetic field) to the magnetic sensor 1, more specifically the MR element 12.

The DC power source 32 and the ammeter 33 are connected in series. The AC voltmeter 31 is connected in parallel with the DC power source 32. The bias tee 34 includes a capacitor 35 and an inductor 36. The bias tee 34 has a function to conduct AC current to the AC voltmeter 31 and to conduct DC current to the power source 32 and the ammeter 33.

Figure 4:
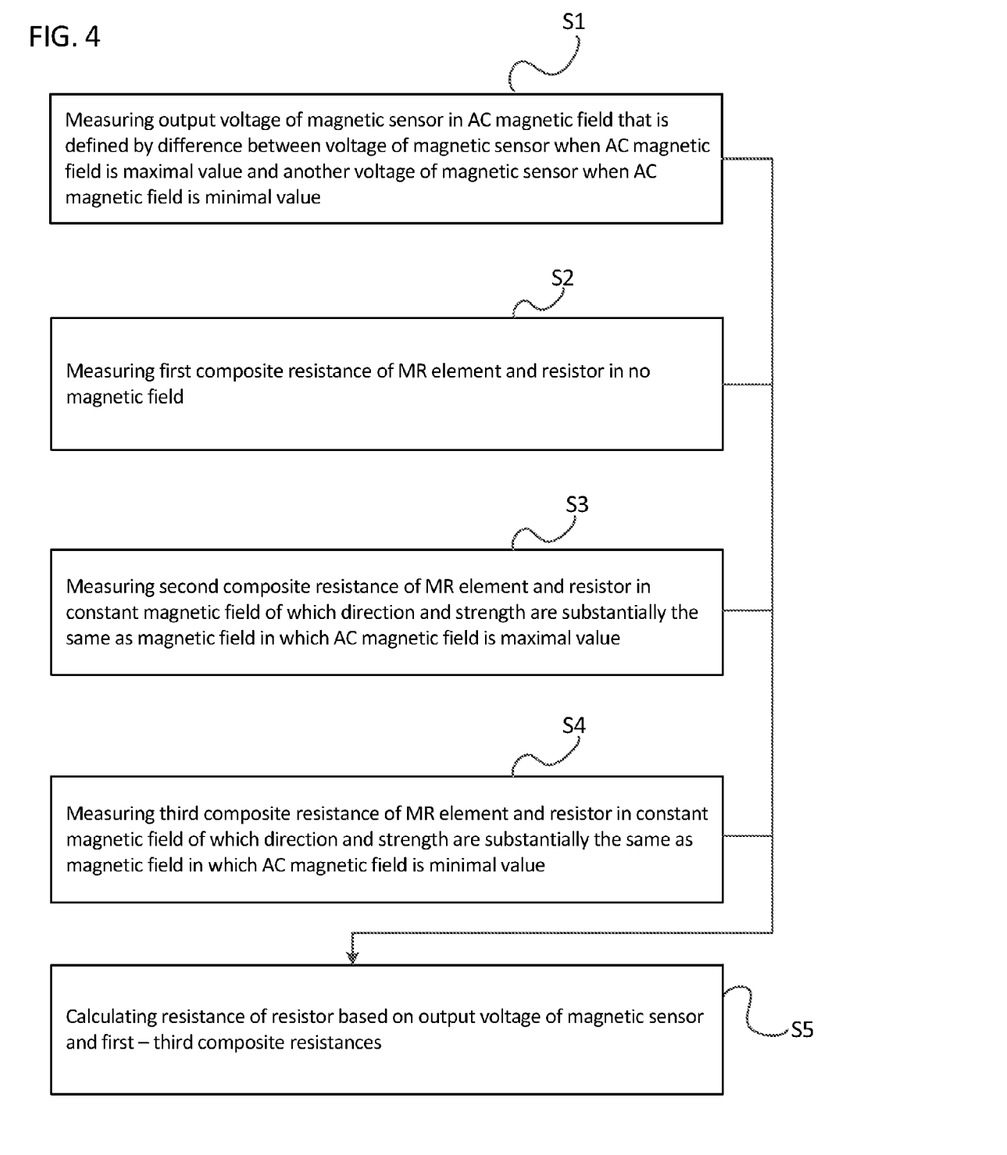
FIG. 4 is a step diagram illustrating a method in a first embodiment for measuring a resistance of a resistor connected in parallel with the magnetic sensor.

FIG. 4 illustrates a flow diagram of the method for measuring a resistance of the resistor 13. As a first step (S1) of the measuring method, an output voltage of the magnetic sensor 1 is measured in an AC magnetic field. In the present embodiment, the output voltage of the magnetic sensor 1 is defined by a difference between a voltage of the magnetic sensor when the AC magnetic field is a maximal value and another voltage of the magnetic sensor when the AC magnetic field is a minimal value. The output voltage is related to an output voltage of the MR element 12.

Figure 5:
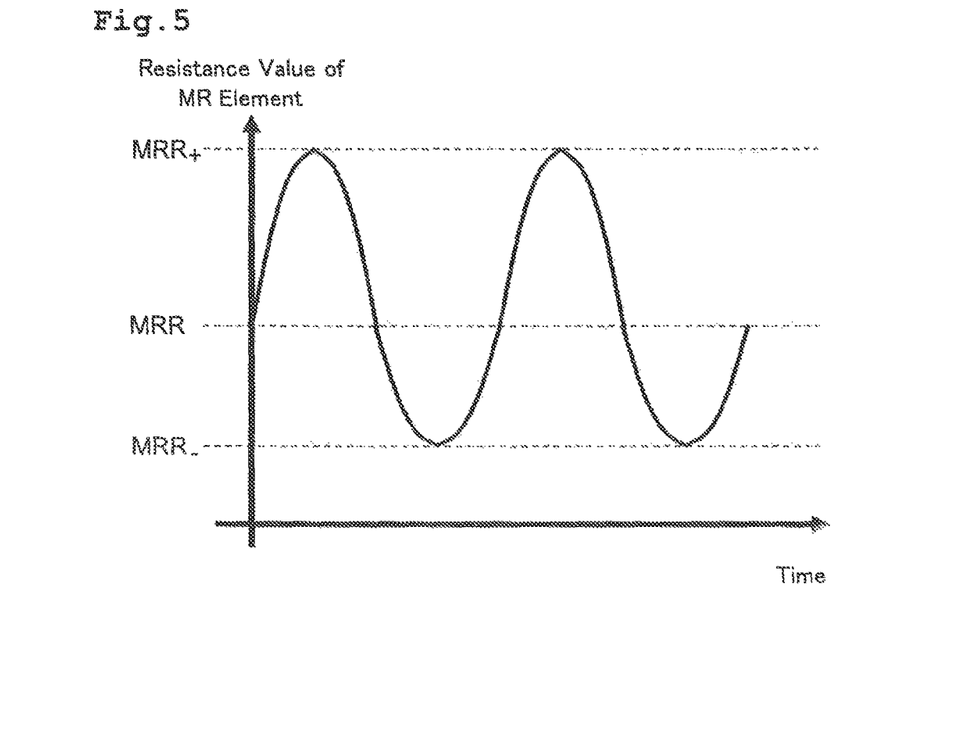
FIG. 5 is a graph illustrating a resistance variation of the MR element when an alternating-current (AC) magnetic field is applied.

Generally, a resistance of an MR element varies periodically in an AC magnetic field. FIG. 5 is a graph illustrating a resistance variation of the MR element in an AC magnetic field. As illustrated in FIG. 5, a resistance of the MR element varies periodically in response to the variation of an external magnetic field. "$MRR_+$" represents a resistance of the MR element 12 when the AC magnetic field is the maximal value; "$MRR_-$" represents a resistance of the MR element 12 when the AC magnetic field is the minimal value; and "MRR"

represents a resistance of the MR element 12 in no magnetic field, i.e., where an external magnetic field is not applied.

The resistance of the MR element 12 varies periodically due to the AC magnetic field, and in turn an AC current flows in the circuit. Therefore, considering the function of the bias tee 34, the circuit of the FIG. 3 may be simplified to an equivalent circuit of FIG. 6. Herein, the resistance of the MR element 12 varies periodically, so that voltage $V_{MR}$ of the MR element 12 also varies as illustrated in FIG. 7. Therefore, the voltage variation of the MR element 12 is regarded as a voltage variation due to a virtual AC power source 42. In other words, the MR element 12 may be viewed as a synthesis of a virtual resistor 41 that has the same resistance as the resistance MRR in no magnetic field and the virtual AC power source 42.

Figure 6:
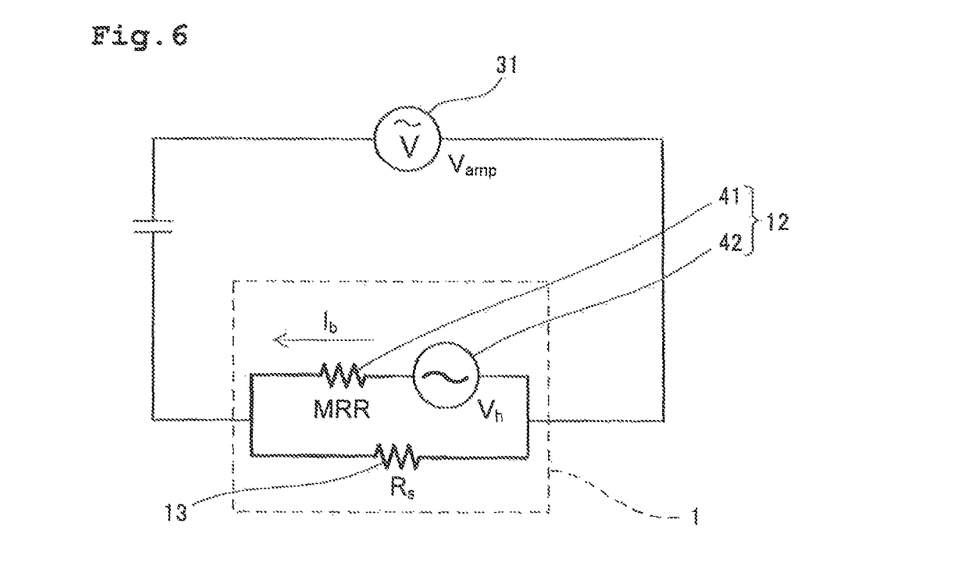
FIG. 6 is a circuit diagram illustrating an equivalent circuit of the total system including the measuring system and the magnetic sensor when an AC magnetic field is applied to the MR element.
Figure 7:
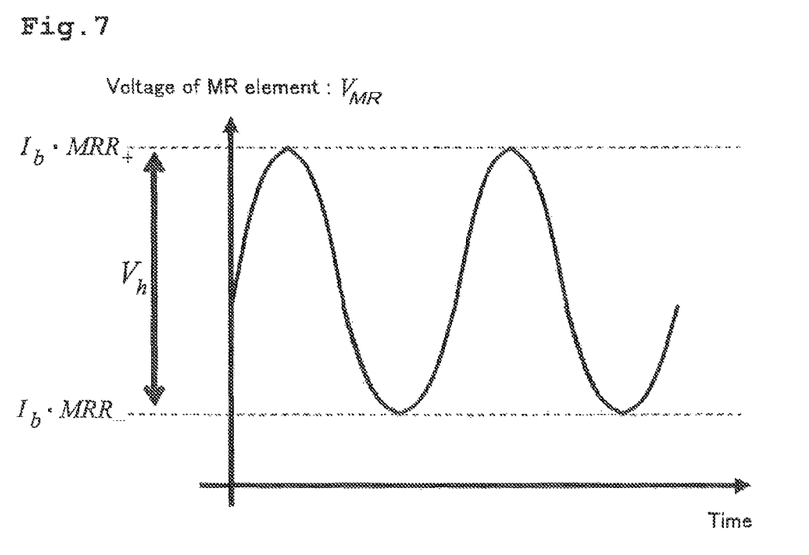
FIG. 7 is a graph explaining a definition of an output voltage of the MR element in the first embodiment when the AC magnetic field is applied.

With the equivalent circuit illustrated in FIG. 6, a voltage value V measured by the AC voltmeter 31, i.e., a voltage value V applied over an entirety of the magnetic sensor 1, corresponds to a partial pressure applied to either the resistor 13 or the resistor 41, i.e., a partial pressure of a voltage (the voltage $V_{MR}$ of the MR element 12) by the virtual AC power source 42. Therefore, the voltage value V and the voltage value $V_{MR}$ of the MR element satisfy the following relational expression:

$$V = \frac{R_S}{R_S + MRR} \cdot V_{MR} \tag{1}$$

Figure 8:
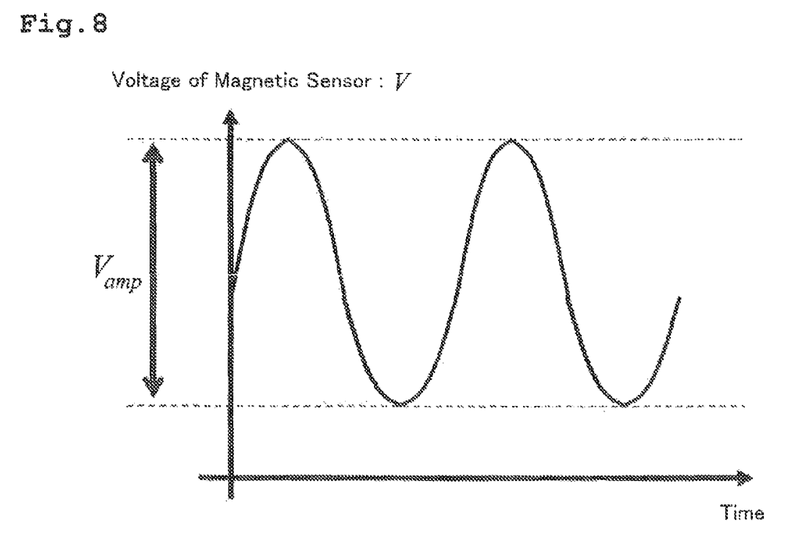
FIG. 8 is a graph explaining a definition of an output voltage of the magnetic sensor in the first embodiment when the AC magnetic field is applied.

Herein, $R_s$ represents a resistance of the resistor 13, which is ultimately to be measured. When the voltage value $V_{MR}$ of the MR element 12 varies as illustrated in FIG. 7 by the AC magnetic field being applied to the MR element 12, the voltage value V applied over an entirety of the magnetic sensor 1 varies as illustrated in FIG. 8.

In the present embodiment, an output voltage $V_{amp}$ of the magnetic sensor 1 is defined by a difference between a voltage of the magnetic sensor when the AC magnetic field is a maximal value and another voltage of the magnetic sensor when the AC magnetic field is a minimal value. Therefore, the output voltage $V_{amp}$ of the magnetic sensor 1 is provided by the following expression:

$$V_{amp} = \frac{R_S}{R_S + MRR} \cdot V_h \tag{2}$$

Herein, the $V_h$, which is also referred to as an output voltage of the MR element 12 (see FIGS. 7 and 8), is defined by the following expression:

$$V_h = (MRR_+ - MRR_-) \cdot I_b \tag{3}$$

$I_b$ represents a bias current that flows to the MR element 12. The output voltage $V_h$ of the MR element 12 is a difference between the maximum value MRR and the minimum value MRR of the resistance of the MR element 12 when the AC magnetic field is applied to the MR element 12 (see FIG. 7).

In the above-described expression, the bias current $I_b$ is approximated to be a constant value. In fact, the bias current $I_b$ slightly varies corresponding to the variation of the resistance of the MR element 12. However, since a magneto resistance ratio of the MR element 12 is sufficiently small compared to the resistance MRR of the MR element 12 and the resistance $R_s$ of the resistor 13, the bias current $I_b$ can be approximated to be a constant value. As a typical example, the resistance of the resistor 13 is approximately 800Ω-3kΩ, the resistance of the MR element is approximately 300Ω-1kΩ, the magneto resistance ratio of the MR element 12 is approximately 50%-100%.

More preferably, the bias current $I_b$ is approximated to a value that corresponds to the current value that flows in the MR element 12 when the bias voltage $V_b$ is applied to the magnetic sensor 1 in no magnetic field. Namely, the bias current $I_b$ is approximated to a value obtained by the following relational expression:

$$V_b = MRR \cdot I_b \tag{4}$$

When $I_b$ is eliminated using the expression (4) from the equation obtained by substituting the expression (3) to the expression (2), provided is the following relational expression:

$$V_{amp} = \frac{R_S}{(R_S + MRR)} \cdot (MRR_+ - MRR_-) \cdot \frac{V_b}{MRR} \tag{5}$$

Herein, MRR, $MRR_+$ and $MRR_-$ are expressed using respectively the combined resistances of the MR element 12 and the resistor 13 $MRR_p$, $MRR_{p+}$ and $MRR_{p-}$, and the resistance $R_s$ of the resistor 13 as the following expressions:

$$MRR = \frac{MRR_p \cdot R_S}{R_S - MRR_p} \tag{6}$$

$$MRR_+ = \frac{MRR_{p+} \cdot R_S}{R_S - MRR_{p+}} \tag{7}$$

$$MRR_- = \frac{MRR_{p-} \cdot R_S}{R_S - MRR_{p-}} \tag{8}$$

Herein, $MRR_p$ represents the combined resistance (a first combined resistance) of the MR element 12 and the resistor 13 in no magnetic field. $MRR_{p+}$ represents the combined resistance (a second combined resistance) of the MR element 12 and the resistor 13 when the AC magnetic field is the maximal value. Moreover, $MRR_{p-}$ represents the combined resistance (a third combined resistance) of the MR element 12 and the resistor 13 when the AC magnetic field is the minimal value.

When the expressions (6)-(8) are substituted to the expression (5), provided is the following relational expression:

$$V_{amp} = \frac{(MRR_{p+} - MRR_{p-}) \cdot (R_S - MRR_p)^2}{(R_S - MRR_{p+}) \cdot (R_S - MRR_{p-}) MRR_p} \cdot V_b \tag{9}$$

The expression (9) represents a relationship between the output voltage $V_{amp}$ of the magnetic sensor 1 obtained at S1 and the known bias voltage $V_b$. Since the combined resistances $MRR_p$, $MRR_{p+}$ and $MRR_{p-}$ are the resistance over an entirety of the magnetic sensor 1, they are easy to measure. According to the expression (9), the resistance $R_s$ of the resistor 13 may be calculated using the bias voltage $V_b$, the output voltage $V_{amp}$ of the magnetic sensor 1, and the combined resistances $MRR_p$, $MRR_{p+}$ and $MRR_{p-}$.

By using the defined program that may numerically solve the expression (9), it may be possible to calculate the resistance $R_s$ of the resistor. Further, it may also be possible to solve the expression (9) as follows.

By multiplying both members of the expression (9) by "$(R_s-MRR_{p+})(R_s-MRR_{p-})MRR_p$", a quadratic equation for Rs is obtained:

$$A \cdot R_s^2 + B \cdot R_s + C = 0 \quad (10)$$

Herein, coefficients A, B and C are provided by the following expressions:

$$A \equiv MRR_p \cdot V_{amp} - (MRR_{p+} - MRR_{p-}) \cdot V_b \quad (11)$$

$$B \equiv (MRR_{p+} + MRR_{p-}) \cdot MRR_p \cdot V_{amp} - 2(MRR_{p+} - MRR_{p-}) \cdot MRR_p \cdot V_b \quad (12)$$

$$C \equiv MRR_{p+} \cdot MRR_{p-} \cdot MRR_p \cdot V_{amp} - MRR_p^2 (MRR_{p+} - MRR_{p-}) \cdot V_b \quad (13)$$

The expressions (10)-(13) are equivalent to the expression (9).

By solving the expression (10) for $R_s$, $R_s$ is expressed as the following expression:

$$R_S = \frac{B \pm \sqrt{B^2 - 4A \cdot C}}{2A} \quad (14)$$

The expression (14) includes double signs (positive and negative); thereby the expression formally provides two solutions. Therefore, in order that the resistance $R_s$ of the resistor 13 becomes a value that practically has a physical meaning without contradictions, one of the double signs (or positive or negative) is selected. In many cases, considering the resistance $R_s$ becomes a value that is larger than the combined resistances $MRR_p$, $MRR_{p+}$ and $MRR_{p-}$, a proper value of $R_s$ is obtained by the expression (14).

Next, S2-S4 at which the combined resistances $MRR_p$, $MRR_{p+}$ and $MRR_{p-}$ are measured will be explained (see also FIG. 4). S2, S3 and S4 are executed in no magnetic field or in a constant magnetic field. In this case, since the resistance of the MR element 12 does not vary, a DC current flows in the equivalent circuit illustrated in FIG. 3. Therefore, considering the function of the bias tee 34, the circuit illustrated in FIG. 3 may be simplified to an equivalent circuit illustrated in FIG. 9.

Figure 9:
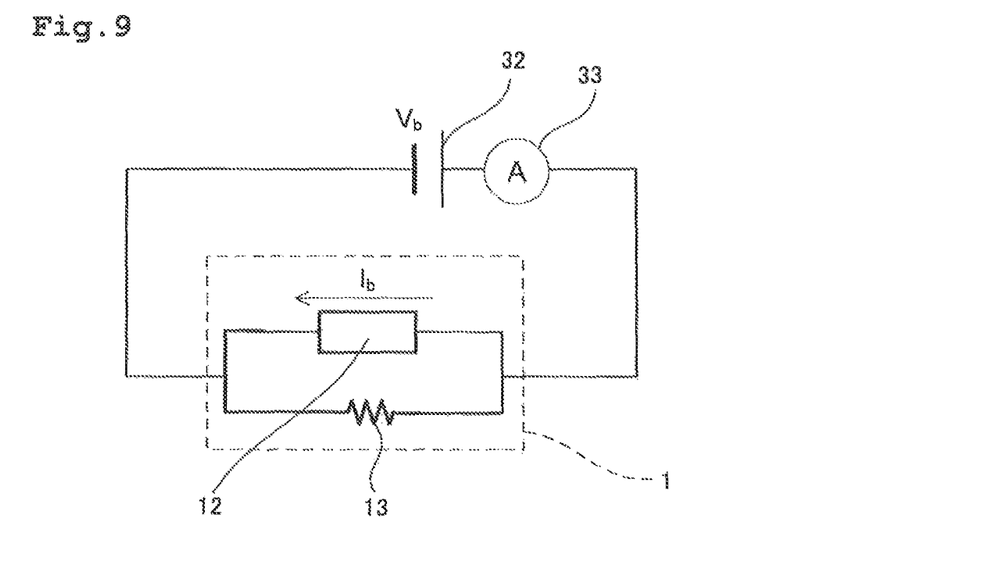
FIG. 9 is a circuit diagram illustrating a equivalent circuit of the total system including the measuring system and the magnetic sensor when a constant magnetic field is applied to the MR element.

With the equivalent circuit illustrated in FIG. 9, the combined resistance of the MR element 12 and the resistor 13 may be measured by the DC power source 32 and the (DC) ammeter 33.

Specifically, the first combined resistance of the MR element 12 and the resistor 13 $MRR_p$ is measured in no magnetic field at S2.

The second combined resistance of the MR element 12 and the resistor 13 $MRR_{p+}$ is measured in the constant magnetic field at S3. The direction and/or strength of the constant magnetic field is set such that the resistance of the MR element 12 corresponds to the maximal value $MRR_+$ in the AC magnetic field at S1. Therefore, it is desired that the direction and strength of the constant magnetic field are substantially the same as the magnetic field in which the AC magnetic field is maximal at S1.

At S4, a third combined resistance of the MR element 12 and the resistor 13 $MRR_{p-}$ is measured in another constant magnetic field. The direction and/or strength of the constant magnetic field is set such that the resistance of the MR element 12 corresponds to the minimum value $MRR_-$ in the AC magnetic field at S1. Therefore, it is desired that the direction and strength of the constant magnetic field are substantially the same as the magnetic field in which the AC magnetic field is the minimum at S1.

As described above, using the first, second and third combined resistances $MRR_p$, $MRR_{p+}$ and $MRR_{p-}$ obtained at S2-S4, the expression (9) is numerically solved or the expressions (11)-(14) are calculated so that the resistance $R_s$ of the resistor 13 is calculated (S5).

According to the above-described measuring method, the resistance of the resistor 13 may be calculated based on the output voltage $V_{amp}$ of the magnetic sensor 1 and the first, second and third combined resistances $MRR_p$, $MRR_{p+}$ and $MRR_{p-}$. Since the physical quantities are obtained by measuring over an entirety of the magnetic sensor 1, it is unnecessary to directly measure the MR element 12 and the resistor 13. As a result, even though the MR element 12 and the resistor 13 are built in the magnetic sensor 1, it is possible to measure the resistance of the resistor 13 without breaking the magnetic sensor 1. Specifically, the measuring method of the present invention has an advantage that the resistance of the resistor 13 may be measured without cutting off the insulation layer 16 even when the resistor 13 is embedded in the insulation layer 16.

The measuring system 30 may have an operation processing part that integrates a program for solving the above-described expression (9) numerically and directly or a program for calculating the above-described expressions (11)-(14). In this case, the resistance $R_s$ of the resistor 13 may be automatically calculated when each of the measurements at S1-S4 is finished. In addition, the measuring steps S1-S4 may be executed in any order.

Also, in the above described embodiment, an example to execute the steps S1-S4 with the same measuring system 30 was explained. On the other hand, it may be also possible to configure the measuring system to execute each of the steps with individual devices.

Figure 10:
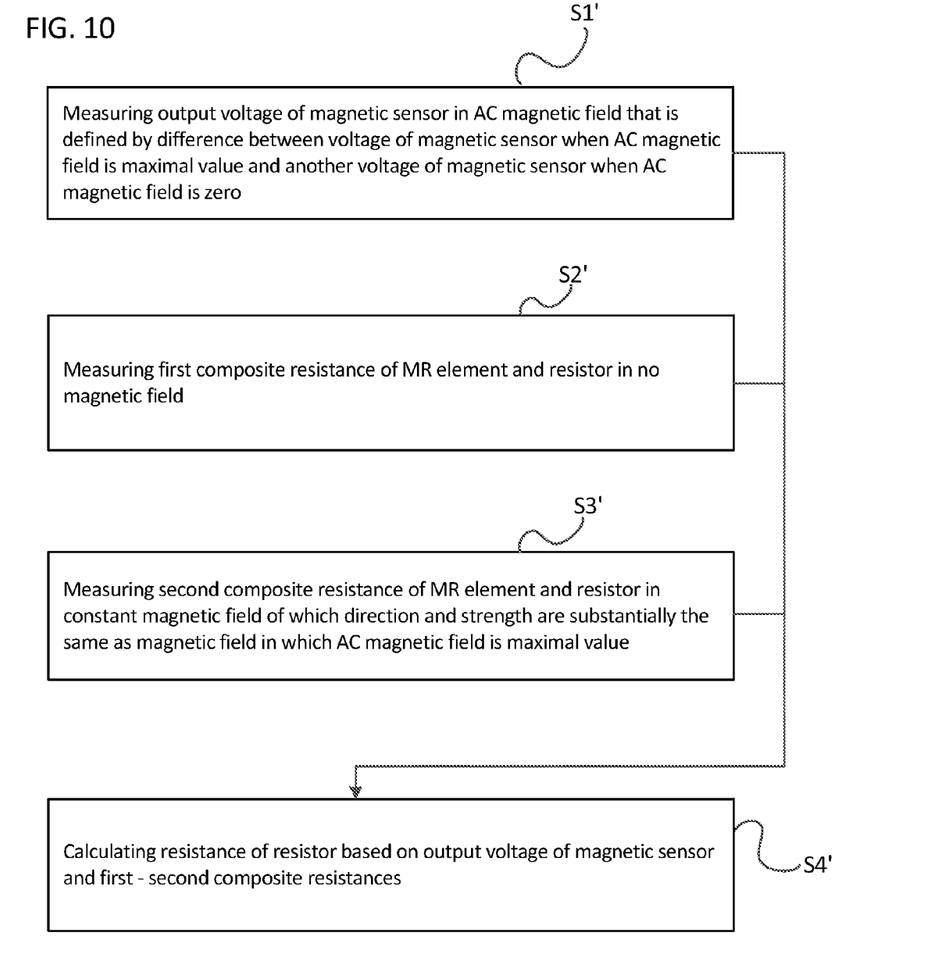
FIG. 10 is a step diagram illustrating a measuring method in a second embodiment.
Figure 11:
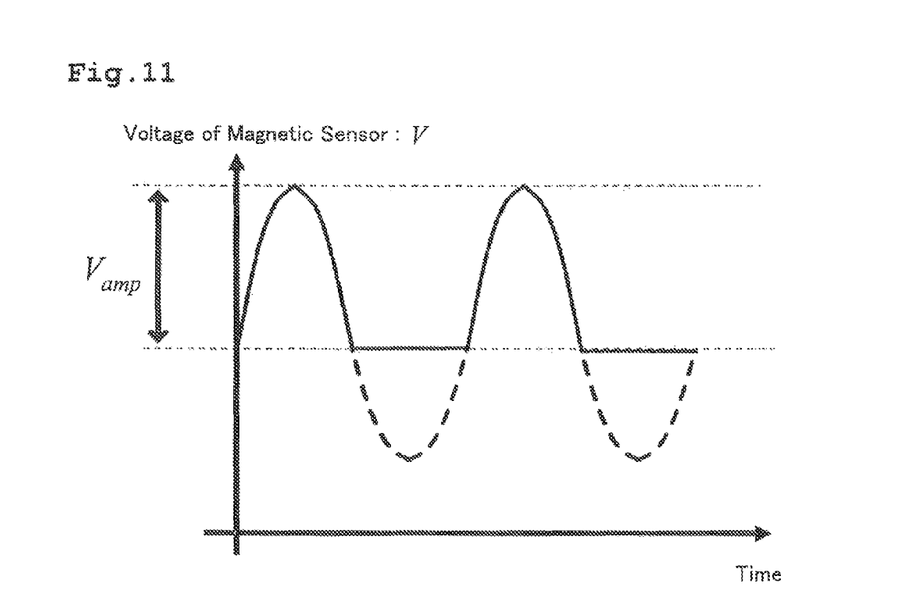
FIG. 11 is a graph explaining a definition of an output voltage of a magnetic sensor in the second embodiment.
Figure 12:
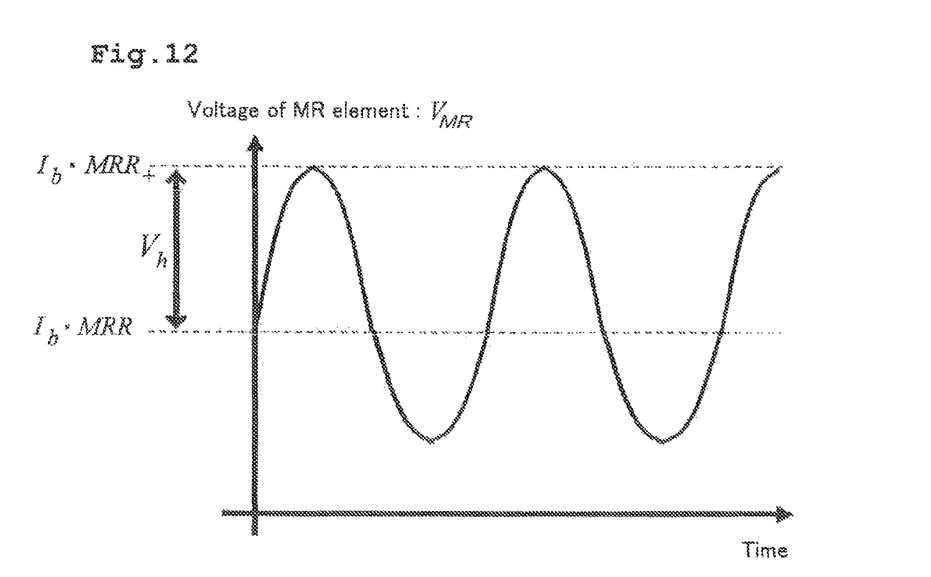
FIG. 12 is a graph explaining a definition of an output voltage of an MR element in the second embodiment.

Next, a measuring method of a second embodiment will be explained. FIG. 10 illustrates a flow diagram of a measuring method of a resistance of the resistor 13 of the magnetic sensor 1. At S1' of the measuring method, an output voltage of the magnetic sensor 1 in an AC magnetic field is measured. In the measuring method of the second embodiment, the output voltage $V_{amp}$ of the magnetic sensor is defined by a difference between a voltage of the magnetic sensor when the AC magnetic field is a maximal value and another voltage of the magnetic sensor when the AC magnetic field is zero (see FIG. 11). Therefore, the output voltage $V_{amp}$ of the magnetic sensor 1 is defined by the following expressions (see also FIG. 12):

$$V_{amp} = \frac{R_S}{R_S + MRR} \cdot V_h \quad (2)$$

$$V_h = (MRR_+ - MRR) \cdot I_b \quad (3')$$

$I_b$ represents a bias current that flows in the MR element. Namely, the newly defined output voltage $V_{amp}$ of the magnetic sensor is regarded as voltage obtained by using the expression (3') in place of the expression (3) for the output voltage of the MR element. Also in the measuring method of the present embodiment, an approximation expressed by the above-described expression (4) is used.

Also at S1', the output voltage $V_{amp}$ of the magnetic sensor may be measured using the same system as the measuring system illustrated in FIG. 3. In addition, it is preferred that the operation processing part processes such that the output voltage $V_{amp}$ of the magnetic sensor is a difference between a voltage of the magnetic sensor when the AC magnetic field is a maximal value and another voltage of the magnetic sensor when the AC magnetic field is zero. Alternatively, it is possible to use a different measuring system 50 illustrated in FIG. 13.

Figure 13:
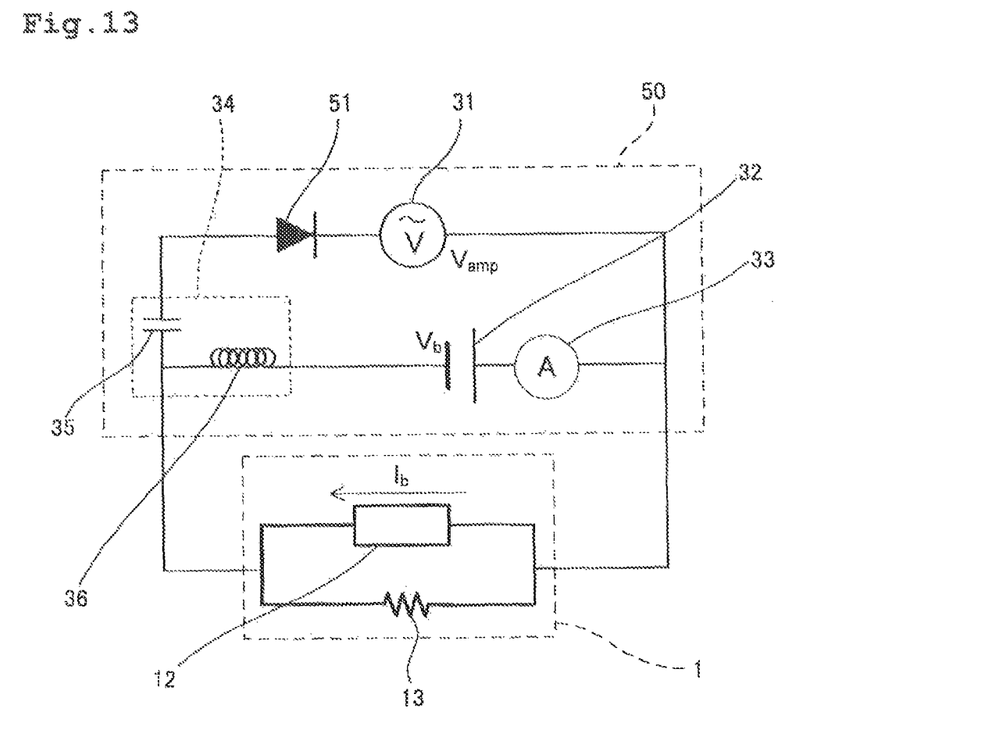
FIG. 13 is a circuit diagram illustrating an equivalent circuit of the total system including the magnetic sensor and another measuring system connected with the magnetic sensor.

FIG. 13 is a circuit diagram illustrating an equivalent circuit of the total system including the magnetic sensor 1 and the alternative measuring system 50 connected with the magnetic sensor. In FIG. 13, the same reference numbers are provided to the same configuration elements as in FIG. 3. The explanation of the same configuration elements is omitted.

The measuring system 50 illustrated in FIG. 13 is almost the same as the system 30 illustrated in FIG. 3 and includes a diode 51 in series with the AC voltmeter 31. When the AC magnetic field is applied to the MR element 12, the voltage value detected by the AC voltmeter 31 due to rectification of the diode 51 is illustrated by a solid line of FIG. 11. Therefore, by determining a difference between a maximum value and a minimum value of the voltage value detected by the AC voltmeter 31, the output voltage $V_{amp}$ of the second embodiment may be measured.

Comparing the expressions (2), (3) and (4) with the expressions (2), (3') and (4), it is determined that MRR is replaced with MRR. In view of the expressions (6)-(8), this corresponds to the replacement of $MRR_{p-}$ with $MRR_p$. Therefore, by replacing $MRR_{p-}$ with $MRR_p$ in the expressions (9)-(14), an expression for calculating the resistance $R_s$ of the resistor by the measuring method of the second embodiment may be obtained.

The expression for calculating the resistance $R_s$ is represented as $$V_{amp} = \frac{(MRR_{p+} - MRR_p) \cdot (R_s - MRR_p)^2}{(R_s - MRR_{p+}) \cdot (R_s - MRR_p) MRR_p} \cdot V_b \quad (9')$$

As an equivalent expression with the above, $R_s$ is represented as $$R_S = \frac{B \pm \sqrt{B^2 - 4A \cdot C}}{2A} \quad (14')$$

Herein A, B and C are:

$$A \equiv MRR_p \cdot V_{amp} - (MRR_{p+} - MRR_p) \cdot V_b \quad (11')$$

$$B \equiv (MRR_{p+} + MRR_p) \cdot MRR_p \cdot V_{amp} - 2(MRR_{p+} - MRR_p) \cdot MRR_p \cdot V_b \quad (12')$$

$$C \equiv MRR_{p+} \cdot MRR_p^2 \cdot V_{amp} - MRR_p^2 (MRR_{p+} - MRR_p) \cdot V_b \quad (13')$$

At S2', a first combined resistance of the MR element 12 and the resistor 13 $MRR_p$ is measured in no magnetic field. At S3', a second combined resistance of the MR element 12 and the resistor 13 $MRR_{p+}$ is measured in a constant magnetic field. A direction and/or strength of the constant magnetic field are/is set such that the resistance of the MR element 12 corresponds to the maximal value $MRR_+$ in the AC magnetic field at S1'. Therefore, it is desired that the direction and strength of the constant magnetic field are substantially the same as a magnetic field in which the AC magnetic field is maximal at S1'.

The resistance $R_s$ of the resistor 13 is calculated (S4') by numerically solving the expression (9'), or calculating the expressions (11')-(14') using the first and second combined resistances $MRR_p$ and $MRR_{p+}$ obtained at S2'-S3' as described above.

In the measuring method of the second embodiment, the expressions (9') and (11')-(14') to obtain $R_s$ do not include the combined resistance $MRR_-$. Therefore, compared to the measuring method of the first embodiment, there is an advantage that enables elimination of one step for measuring the combined resistance under a state where the constant magnetic field is applied.

Also, compared to the measuring method of the first embodiment, because one measured value that is necessary to obtain $R_s$ is eliminated, there is also an advantage that may suppress deterioration of accuracy due to measurement error.

Figure 14:
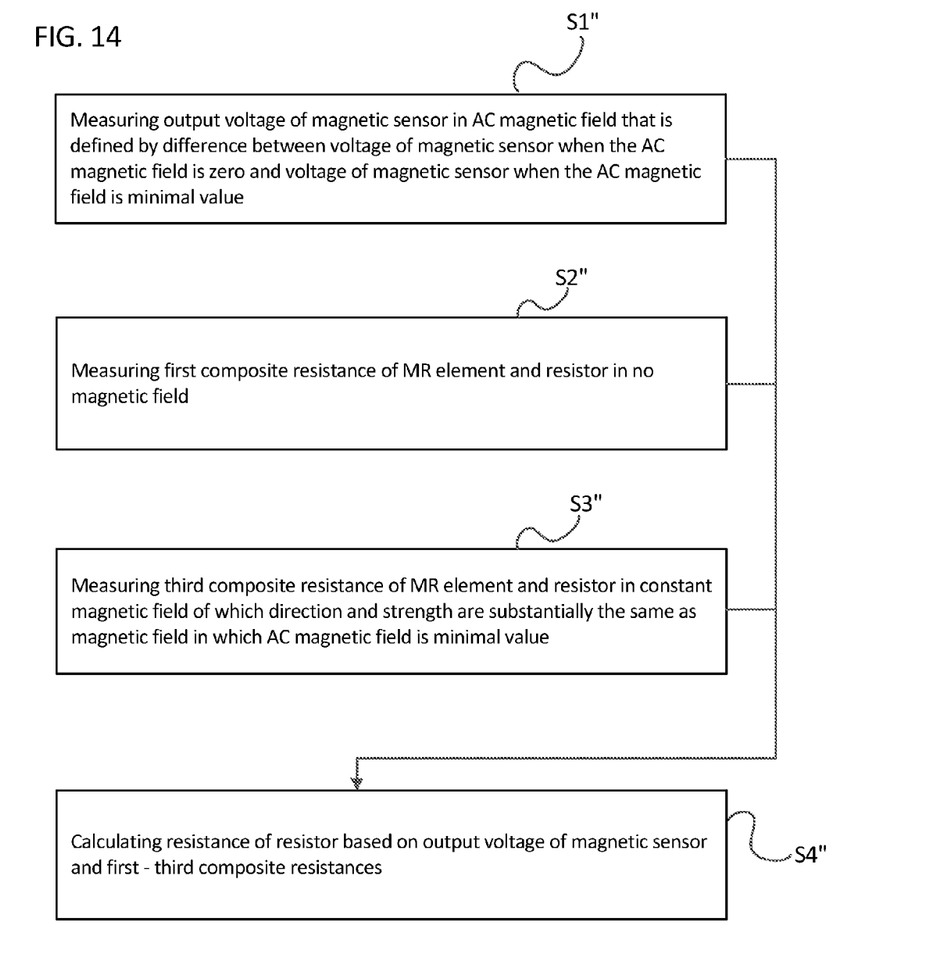
FIG. 14 is a step diagram illustrating a measuring method in a third embodiment.
Figure 15:
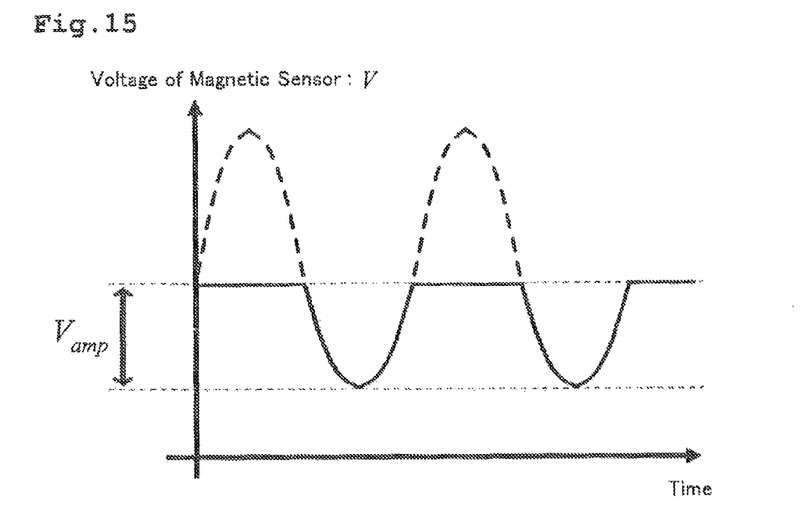
FIG. 15 is a graph explaining a definition of an output voltage of a magnetic sensor in the third embodiment.
Figure 16:
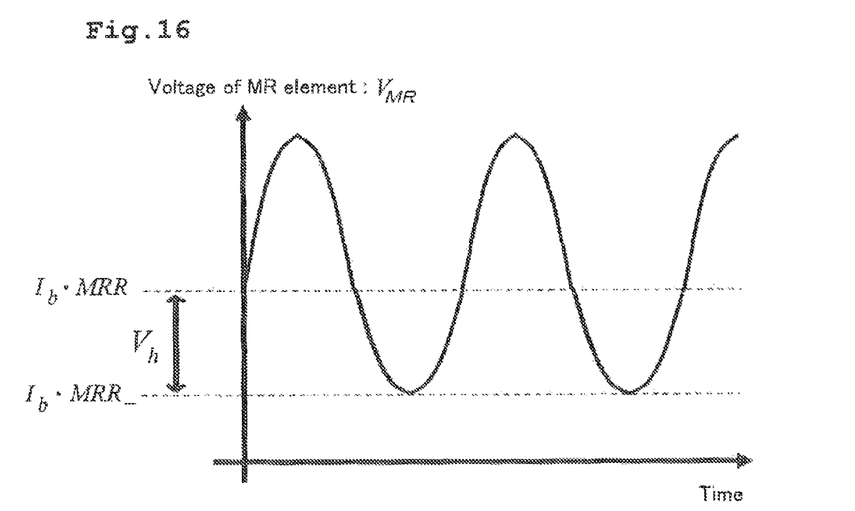
FIG. 16 is a graph explaining a definition of an output voltage of an MR element in the third embodiment.

Next, a measuring method of a third embodiment will be explained. FIG. 14 is a flow diagram illustrating a measuring method of a resistance of the resistor 13 of the magnetic sensor 1. At S1" of the measuring method, an output voltage of the magnetic sensor 1 is measured in an AC magnetic field. Additionally, in the measuring method of the third embodiment, an output voltage $V_{amp}$ of the magnetic sensor is defined by a difference between a voltage of the magnetic sensor when the AC magnetic field is zero and a voltage of the magnetic sensor when the AC magnetic field is a minimum value (see FIG. 15). Therefore, the output voltage $V_{amp}$ of the magnetic sensor 1 is defined by the following expressions (see also FIG. 16):

$$V_{amp} = \frac{R_S}{R_S + MRR} \cdot V_h \quad (2)$$

$$V_h = (MRR - MRR_-) \cdot I_b \quad (3'')$$

$I_b$ is a bias current that flows in the MR element. Namely, in the measuring method of the third embodiment, the output voltage $V_{amp}$ of the magnetic sensor is regarded as voltage obtained by using the expression (3') in place of the expression (3) for the output voltage of the MR element. Also in the measuring method of the present embodiment, approximation represented by the above-described expression (4) is used.

At S1", the output voltage $V_{amp}$ of the magnetic sensor may be measured using the same system as the measuring system illustrated in FIG. 3. In addition, it is preferred that the operation processing part of the measuring system processes such that the output voltage $V_{amp}$ of the magnetic sensor is the difference between the voltage of the magnetic sensor when the AC magnetic field is the minimal value and the voltage of the magnetic sensor when the AC magnetic field is zero. Alternatively, the alternative/different measuring system 50 illustrated in FIG. 13 may be also used. When the measuring system 50 illustrated in FIG. 13 is used, it is required that the diode 51 is disposed in an opposite direction from the second embodiment such that a current flows in the opposite direction. As a result, a voltage value detected by the AC voltmeter 31 is represented as a solid line in FIG. 15. Therefore, by obtaining a difference between a maximum value and a minimum value of the voltage value detected by the AC voltmeter 31, the output voltage $V_{amp}$ by the measuring method of the third embodiment may be measured.

Comparing the expressions (2), (3) and (4) with the expressions (2), (3") and (4), it is determined that $MRR_+$ is replaced with MRR. In view of the expressions (6)-(8), this corresponds to the replacement of $MRR_{p+}$ with $MRR_p$. Therefore, by replacing $MRR_{p+}$ with $MRR_p$ in the expressions (9)-(14), an expression for calculating the resistance $R_s$ of the resistor by the measuring method of the third embodiment may be obtained.

The expression for calculating the resistance $R_s$ is represented as $$V_{amp} = \frac{(MRR_p - MRR_{p-}) \cdot (R_S - MRR_p)^2}{(R_S - MRR_p) \cdot (R_S - MRR_{p-})MRR_p} \cdot V_b \quad (9'')$$

As an equivalent expression with the above, $R_s$ is represented as $$R_S = \frac{B \pm \sqrt{B^2 - 4A \cdot C}}{2A} \quad (14'')$$

Herein, A, B, and C are:

$$A \equiv MRR_p \cdot V_{amp} - (MRR_p - MRR_{p-}) \cdot V_b \quad (11'')$$

$$B \equiv (MRR_p + MRR_{p-}) \cdot MRR_p \cdot V_{amp} - 2(MRR_p - MRR_{p-}) \cdot MRR_p \cdot V_b \quad (12'')$$

$$C \equiv MRR_p^2 \cdot MRR_p \cdot V_{amp} - MRR_p^2(MRR_p - MRR_{p-}) \cdot V_b \quad (13'')$$

At S2", a first combined resistance of the MR element 12 and the resistor 13 $MRR_p$ is measured in no magnetic field. At S3", a third combined resistance of the MR element 12 and the resistor 13 $MRR_{p-}$ is measured in a constant magnetic field. A direction and/or strength of the constant magnetic field is set such that the resistance of the MR element 12 corresponds to the minimum value $MRR_-$ in the AC magnetic field at S1". Therefore, it is desired that the direction and strength of the constant magnetic field are substantially the same as a magnetic field in which the AC magnetic field is minimum at S1".

At S4", the resistance $R_s$ of the resistor 13 is calculated either by numerically solving the expression (9") or by calculating the expressions (11")-(14") with the first and third combined resistances $MRR_p$ and $MRR_{p-}$ obtained at S2"-S3" as described above.

In the measuring method of the third embodiment, the expressions (9") and (11")-(14") to obtain $R_s$ do not include the combined resistance $MRR_+$. Therefore, compared to the measuring method of the first embodiment, there is an advantage that enables elimination of one step for measuring the combined resistance under a state where the constant magnetic field is applied.

Also, compared to the measuring method of the first embodiment, because one measured value that is necessary to obtain $R_s$ is eliminated, there is also an advantage in that deterioration of accuracy due to measurement error may be suppressed.

Hereafter, regarding the expressions (14) and (14"), or (14") to obtain $R_s$, a method for determining analytically if either sign of double sign should be selected will be discussed.

Initially, the following expression needs to be modified:

$$R_S - \frac{B}{2A} \quad (15)$$

In the measuring method of the first embodiment, the expressions (11) and (12) are substituted to the expression (15), and A and B are eliminated. Then, the following expression is obtained:

$$R_S - \frac{B}{2A} = \frac{(2R_S - MRR_{p+} - MRR_{p-})MRR_p \cdot V_{amp} - 2(MRR_{p+} - MRR_{p-}) \cdot (R_S - MRR_p) \cdot V_b}{2\{MRR_p \cdot V_{amp} - (MRR_{p+} - MRR_{p-}) \cdot V_b\}} \quad (16)$$

Next, using the expressions (5)-(8), $V_{amp}$, $MRR_p$, $MRR_{p+}$ and $MRR_{p-}$ are eliminated from the expression (16). Then, using $MRR$, $MRR$ and $MRR$, the expression (16) is expressed as follows:

$$R_S - \frac{B}{2A} = \frac{R_S^2 \cdot (MRR_+ + MRR_- - 2 \cdot MRR)}{2 \cdot (MRR + R_S) \cdot (MRR_+ + MRR_- - 2 \cdot MRR) - 2 \cdot (MRR_+ - MRR) \cdot (MRR - MRR_-)} \quad (17)$$

In the measuring methods of the second and third embodiments, as described above, by replacing $MRR_-$ with $MRR$ or replacing $MRR_+$ with $MRR$, the following expression is obtained:

$$R_S - \frac{B}{2A} = \frac{R_S^2}{2 \cdot (MRR + R_S)} \quad (18)$$

In both of the measuring methods of the second and third embodiments, the expression (18) is obtained.

Actually, since MRR is more than zero and $R_s$ is more than zero (MRR>0 and $R_s$>0), the expression (18) obviously is a positive number. Therefore, by the expressions (14') and (14"), the following inequality is obtained:

$$\frac{\pm \sqrt{B^2 - 4A \cdot C}}{2A} = R_S - \frac{B}{2A} > 0 \quad (19)$$

In order to satisfy the inequality (19), a positive sign needs to be selected from the double sign when A is more than zero (A>0); a negative sign needs to be selected from the double sign when A is less than zero (A<0).

In the measuring methods of the second and third embodiments, using the output voltage $V_{amp}$, the bias voltage $V_b$, the measured values of the combined resistances MRR and $MRR_\pm$, the expression (11') or (11") is calculated. When A is more than zero (A>0), $R_s$ is obtained by the following expression:

$$R_S = \frac{B + \sqrt{B^2 - 4A \cdot C}}{2A} \quad (20)$$

On the other hand, when A is less than zero (A<0), $R_s$ is obtained by the following expression:

$$R_S = \frac{B - \sqrt{B^2 - 4A \cdot C}}{2A} \quad (21)$$

As described above, in the measuring methods of the second and third embodiments, there is an advantage that $R_s$ is uniquely and easily determined depending on the positive or negative sign of "A." Such a calculation may be executed by an operation processing part that integrates the predetermined program.

In addition, if A happens to be zero (A=0), the expressions (10), (10') and (10") become linear equations. Therefore, needless to say, the resistance $R_s$ may be easily calculated.

Also, from the measuring method of the second embodiment and the measuring method of the third embodiment, it is preferable to choose the measuring method that leads to a larger output voltage $V_{amp}$ of the magnetic sensor. This is because a ratio of the output voltage $V_{amp}$ of the magnetic sensor with respect to noise, i.e., S/N ratio, becomes preferable.

While preferred embodiments of the present invention have been shown and described in detail, such description is for illustrative purposes only, and it is to be understood that changes and variations may be made without departing from the spirit or scope of the following claims.

What is claimed is:

1. A measuring method that measures a resistance of a resistor of a magnetic sensor that includes a magneto resistance effect (MR) element and the resistor connected in parallel with the MR element, the method comprising:
    a step of measuring an output voltage of the magnetic sensor in an alternating-current (AC) magnetic field, the output voltage being defined by a difference between a voltage of the magnetic sensor when the AC magnetic field is a maximal value and another voltage of the magnetic sensor when the AC magnetic field is a minimal value,
    a step of measuring a first combined resistance of the MR element and the resistor in no magnetic field,
    a step of measuring a second combined resistance of the MR element and the resistor in a constant magnetic field of which a direction and strength are substantially the same as a magnetic field in which the AC magnetic field is the maximal value,
    a step of measuring a third combined resistance of the MR element and the resistor in another constant magnetic field of which a direction and strength are substantially the same as another magnetic field in which the AC magnetic field is the minimal value, and
    a step of calculating the resistance of the resistor based on the output voltage, the first combined resistance, the second combined resistance, and the third combined resistance.

2. The measuring method according to claim 1, wherein the resistance of the resistor is calculated based on the following expression:

$$V_{amp} = \frac{(MRR_{p+} - MRR_{p-}) \cdot (R_S - MRR_p)^2}{(R_S - MRR_{p+}) \cdot (R_S - MRR_{p-}) MRR_p} \cdot V_b$$

where the resistance of the resistor is $R_s$, the output voltage of the magnetic sensor is $V_{amp}$, a bias voltage applied to the magnetic sensor while the output voltage is measured is $V_b$, the first combined resistance is $MRR_p$, the second combined resistance is $MRR_{p+}$, and the third combined resistance is $MRR_{p-}$.

3. The measuring method according to claim 1, wherein the MR element is a tunnel magneto-resistance (TMR) element in which a TMR effect is used.

4. The measuring method according to claim 1, wherein the resistor of the magnetic sensor is covered so as not to be externally exposed.

5. A measuring method that measures a resistance of a resistor of a magnetic sensor that includes a magneto resistance effect (MR) element and the resistor connected in parallel with the MR element, the method comprising:
    a step of measuring an output voltage of the magnetic sensor in an AC magnetic field, the output voltage being defined by a difference between a voltage of the magnetic sensor when the AC magnetic field is a maximal value and another voltage of the magnetic sensor when the AC magnetic field is zero,
    a step of measuring a first combined resistance of the MR element and the resistor in non-magnetic state,
    a step of measuring a second combined resistance of the MR element and the resistor in a constant magnetic field of which a direction and strength are substantially the same as a magnetic field in which the AC magnetic field is the maximal value, and
    a step of calculating a resistance of the resistor based on the output voltage, the first combined resistance and the second combined resistance.

6. The measuring method according to claim 5, wherein the resistance of the resistor is calculated based on the following expression:

$$V_{amp} = \frac{(MRR_{p+} - MRR_p) \cdot (R_S - MRR_p)^2}{(R_S - MRR_{p+}) \cdot (R_S - MRR_p) MRR_p} \cdot V_b$$

where the resistance of the resistor is $R_s$, the output voltage of the magnetic sensor is $V_{amp}$, a bias voltage applied to the magnetic sensor while the output voltage is measured is $V_b$, the first combined resistance is $MRR_p$ and the second combined resistance is $MRR_{p+}$.

7. The measuring method according to claim 5, wherein the MR element is a tunnel magneto-resistance (TMR) element to which a TMR effect is applied.

8. The measuring method according to claim 5, wherein the resistor of the magnetic sensor is covered so as not to be externally exposed.

9. A measuring method that measures a resistance of a resistor of a magnetic sensor that includes a magneto resistance effect (MR) element and the resistor connected in parallel with the MR element, the method comprising:
    a step of measuring an output voltage of the magnetic sensor in an AC magnetic field, the output voltage being defined by a difference between a voltage of the magnetic sensor when the AC magnetic field is zero and another voltage of the magnetic sensor when the AC magnetic field is a minimal value,
    a step of measuring a first combined resistance of the MR element and the resistor in no magnetic field,
    a step of measuring a third combined resistance of the MR element and the resistor in a constant magnetic field of which a direction and strength are substantially the same as a magnetic field in which the AC magnetic field is the minimal value,
    a step of calculating a resistance of the resistor based on the output voltage, the first combined resistance and the third combined resistance.

10. The measuring method according to claim 9, wherein the resistance of the resistor is calculated based on the following expression:

$$V_{amp} = \frac{(MRR_p - MRR_{p-}) \cdot (R_S - MRR_p)^2}{(R_S - MRR_p) \cdot (R_S - MRR_{p-}) MRR_p} \cdot V_b$$

where the resistance of the resistor is $R_s$, the output voltage of the magnetic sensor is $V_{amp}$, a bias voltage applied to the magnetic sensor while the output voltage is measured is $V_b$, the first combined resistance is $MRR_p$ and the third combined resistance is $MRR_{p-}$.

11. The measuring method according to claim 9, wherein the MR element is a tunnel magneto-resistance (TMR) element to which a TMR effect is applied.

12. The measuring method according to claim 9, wherein the resistor of the magnetic sensor is covered so as not to be externally exposed.

\* \* \* \* \*